(12) United States Patent
Jeong

(10) Patent No.: US 9,811,626 B2
(45) Date of Patent: Nov. 7, 2017

(54) METHOD OF DESIGNING LAYOUT OF SEMICONDUCTOR DEVICE

(71) Applicant: Kwangok Jeong, Hwaseong-si (KR)

(72) Inventor: Kwangok Jeong, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/848,758

(22) Filed: Sep. 9, 2015

(65) Prior Publication Data

US 2016/0085897 A1  Mar. 24, 2016

Related U.S. Application Data

(60) Provisional application No. 62/052,076, filed on Sep. 18, 2014.

(30) Foreign Application Priority Data

Mar. 10, 2015 (KR) ........................ 10-2015-0033280

(51) Int. Cl.
*G06F 17/50* (2006.01)

(52) U.S. Cl.
CPC ................................ *G06F 17/5072* (2013.01)

(58) Field of Classification Search
CPC ............. G06F 17/5068; G06F 17/5077; G06F 17/5072; G06F 17/50; G06F 17/5063; G06F 17/5081; G06F 2217/12
See application file for complete search history.

(56) References Cited

U.S. PATENT DOCUMENTS

| | | |
|---|---|---|
| 5,661,419 A | 8/1997 | Bhagwan |
| 6,423,558 B1 | 7/2002 | Maeda et al. |
| 6,469,493 B1 | 10/2002 | Muething, Jr. et al. |

(Continued)

FOREIGN PATENT DOCUMENTS

| | | |
|---|---|---|
| JP | 11211793 | 8/1999 |
| JP | 3233347 B2 | 11/2001 |

(Continued)

OTHER PUBLICATIONS

Hess, et al. "Direct Probing Characterization Vehicle Test Chip for Wafer Level Exploration of Transistor Pattern on Product Chips," IEEE Confrence on Microelectronic Test Structures, pp. 219-223 (2014).

(Continued)

*Primary Examiner* — Nha Nguyen
(74) *Attorney, Agent, or Firm* — Harness, Dickey & Pierce, PLC

(57) ABSTRACT

A method of designing a layout of a semiconductor device includes receiving information on a size of a target chip and a unit placement width for forming a gate line through a self-align double patterning process by a layout design system. The method also includes allocating an input and output area, a hard macro area, and a standard cell area at the target chip, and adjusting a width of the standard cell area by applying a gate generation rule for setting a width of at least one cell row located in the standard cell area to an odd number multiple of the unit placement width. The unit placement width corresponds to a width between centers of a pair of gate lines in the self-align double patterning process.

19 Claims, 11 Drawing Sheets

(56) References Cited

U.S. PATENT DOCUMENTS

| | | | |
|---|---|---|---|
| 6,532,579 B2 | 3/2003 | Sato et al. | |
| 6,662,350 B2 | 12/2003 | Fried et al. | |
| 7,102,413 B2 | 9/2006 | Kuroda | |
| 7,547,597 B2 | 6/2009 | Kau et al. | |
| 7,685,540 B1 * | 3/2010 | Madden | G06F 17/5077 716/118 |
| 7,917,872 B2 | 3/2011 | Tanefusa et al. | |
| 7,956,421 B2 | 6/2011 | Becker | |
| 7,960,759 B2 | 6/2011 | Frederick et al. | |
| 8,102,018 B2 | 1/2012 | Bertin et al. | |
| 8,138,783 B2 | 3/2012 | Rius Vazquez et al. | |
| 8,183,114 B2 | 5/2012 | Tsuboi et al. | |
| 8,224,604 B1 | 7/2012 | Amrutur et al. | |
| 8,239,803 B2 | 8/2012 | Kobayashi | |
| 8,258,578 B2 | 9/2012 | Carlson | |
| 8,264,044 B2 | 9/2012 | Becker | |
| 8,312,394 B2 | 11/2012 | Ban et al. | |
| 8,352,899 B1 | 1/2013 | Yap et al. | |
| 8,362,480 B1 | 1/2013 | Hess et al. | |
| 8,365,108 B2 | 1/2013 | Baum et al. | |
| 8,397,193 B2 | 3/2013 | Ting et al. | |
| 8,543,089 B2 | 9/2013 | Chun et al. | |
| 8,569,841 B2 | 10/2013 | Becker et al. | |
| 8,581,348 B2 | 11/2013 | Rashed et al. | |
| 8,631,382 B2 | 1/2014 | Wang et al. | |
| 8,653,630 B2 | 2/2014 | Liaw et al. | |
| 8,726,215 B2 | 5/2014 | Lee et al. | |
| 8,726,217 B2 | 5/2014 | Gullette | |
| 8,726,220 B2 | 5/2014 | Lin et al. | |
| 8,732,641 B1 | 5/2014 | Yuh et al. | |
| 8,741,763 B2 | 6/2014 | Ma et al. | |
| 8,775,977 B2 | 7/2014 | Hsu et al. | |
| 8,775,999 B2 | 7/2014 | Chueh et al. | |
| 8,782,575 B1 | 7/2014 | Hsu et al. | |
| 8,782,586 B2 | 7/2014 | Sezginer et al. | |
| 8,799,834 B1 | 8/2014 | Chen et al. | |
| 8,802,574 B2 | 8/2014 | Yuan et al. | |
| 8,853,794 B2 | 10/2014 | Becker et al. | |
| 8,878,303 B2 | 11/2014 | Hatamian et al. | |
| 8,902,094 B1 | 12/2014 | Zhang et al. | |
| 8,904,337 B2 | 12/2014 | Yang et al. | |
| 8,924,908 B2 | 12/2014 | Kawa et al. | |
| 8,946,824 B2 | 2/2015 | Ikegami et al. | |
| 8,947,912 B2 | 2/2015 | Calhoun et al. | |
| 8,987,128 B2 | 3/2015 | Rashed et al. | |
| 8,997,026 B1 * | 3/2015 | Sweis | G06F 17/5068 716/50 |
| 9,009,641 B2 | 4/2015 | Becker et al. | |
| 9,021,405 B2 | 4/2015 | Hiramoto et al. | |
| 9,035,393 B2 | 5/2015 | Ma et al. | |
| 9,355,910 B2 | 5/2016 | Rashed et al. | |
| 2001/0044918 A1 | 11/2001 | Sato et al. | |
| 2003/0016551 A1 | 1/2003 | Takemura et al. | |
| 2003/0145299 A1 | 7/2003 | Fried et al. | |
| 2003/0200493 A1 | 10/2003 | Campbell | |
| 2004/0012429 A1 | 1/2004 | Lindberg et al. | |
| 2004/0109368 A1 | 6/2004 | Kuroda | |
| 2004/0133868 A1 * | 7/2004 | Ichimiya | G06F 17/5072 716/120 |
| 2005/0044522 A1 * | 2/2005 | Maeda | G06F 17/5068 716/53 |
| 2005/0155001 A1 | 7/2005 | Kinoshita et al. | |
| 2006/0136848 A1 * | 6/2006 | Ichiryu | G06F 17/5072 716/120 |
| 2006/0225016 A1 * | 10/2006 | Fukasawa | G06F 17/5068 716/122 |
| 2006/0267224 A1 | 11/2006 | Kau et al. | |
| 2007/0075718 A1 | 4/2007 | Hess et al. | |
| 2008/0216041 A1 | 9/2008 | Wangxiao et al. | |
| 2009/0037855 A1 | 2/2009 | Tanefusa et al. | |
| 2009/0091346 A1 | 4/2009 | Chuang et al. | |
| 2009/0144677 A1 | 6/2009 | Gonzalez et al. | |
| 2009/0224317 A1 | 9/2009 | Becker | |
| 2009/0315583 A1 | 12/2009 | Rius Vazquez et al. | |
| 2010/0020376 A1 | 1/2010 | Reynolds | |
| 2010/0090260 A1 | 4/2010 | Frederick et al. | |
| 2010/0093145 A1 | 4/2010 | Tsuboi et al. | |
| 2010/0187615 A1 | 7/2010 | Becker | |
| 2010/0201376 A1 | 8/2010 | Ouyang et al. | |
| 2010/0252892 A1 | 10/2010 | Becker | |
| 2010/0269073 A1 | 10/2010 | Ting et al. | |
| 2011/0014786 A1 | 1/2011 | Sezglner et al. | |
| 2011/0049635 A1 | 3/2011 | Carlson | |
| 2011/0131440 A1 | 6/2011 | Noda | |
| 2011/0289467 A1 | 11/2011 | Kobayashi | |
| 2012/0137261 A1 | 5/2012 | Ban et al. | |
| 2012/0180006 A1 | 7/2012 | Baum et al. | |
| 2012/0192135 A1 | 7/2012 | Gullette | |
| 2012/0210279 A1 | 8/2012 | Hsu et al. | |
| 2012/0254817 A1 * | 10/2012 | Sherlekar | G06F 17/5068 716/119 |
| 2012/0278777 A1 | 11/2012 | Lin et al. | |
| 2012/0299065 A1 | 11/2012 | Shimizu | |
| 2012/0329266 A1 | 12/2012 | Hiramoto et al. | |
| 2013/0016982 A1 | 1/2013 | Henzler | |
| 2013/0021075 A1 | 1/2013 | Felix | |
| 2013/0026572 A1 | 1/2013 | Kawa et al. | |
| 2013/0036397 A1 | 2/2013 | Lee et al. | |
| 2013/0042216 A1 * | 2/2013 | Loh | G06F 17/5068 716/119 |
| 2013/0086542 A1 | 4/2013 | Teoh et al. | |
| 2013/0126978 A1 | 5/2013 | Becker et al. | |
| 2013/0146982 A1 | 6/2013 | Rashed et al. | |
| 2013/0200395 A1 | 8/2013 | Liaw et al. | |
| 2013/0239077 A1 | 9/2013 | Wang et al. | |
| 2013/0242645 A1 | 9/2013 | Calhoun et al. | |
| 2013/0244427 A1 | 9/2013 | Yuan et al. | |
| 2013/0292772 A1 | 11/2013 | Ma et al. | |
| 2013/0320451 A1 | 12/2013 | Liu et al. | |
| 2014/0027918 A1 | 1/2014 | Rashed et al. | |
| 2014/0054722 A1 | 2/2014 | Kawa et al. | |
| 2014/0119099 A1 | 5/2014 | Clark et al. | |
| 2014/0130003 A1 | 5/2014 | Cheuh et al. | |
| 2014/0131816 A1 | 5/2014 | Wang et al. | |
| 2014/0137062 A1 | 5/2014 | Yuh et al. | |
| 2014/0183646 A1 | 7/2014 | Hatamian et al. | |
| 2014/0185365 A1 | 7/2014 | Liaw | |
| 2014/0189635 A1 | 7/2014 | Yang et al. | |
| 2014/0203378 A1 | 7/2014 | Ou et al. | |
| 2014/0208282 A1 | 7/2014 | Hsu et al. | |
| 2014/0210014 A1 | 7/2014 | Ma et al. | |
| 2014/0210015 A1 | 7/2014 | Becker et al. | |
| 2014/0255164 A1 | 9/2014 | Hayes-Pankhurst et al. | |
| 2014/0264894 A1 * | 9/2014 | Tien | H01L 23/5223 257/773 |
| 2015/0143309 A1 * | 5/2015 | De Dood | G06F 17/5068 716/107 |
| 2015/0213184 A1 * | 7/2015 | Yuan | G06F 17/5077 716/129 |
| 2015/0287604 A1 | 10/2015 | Stephens et al. | |
| 2015/0370949 A1 | 12/2015 | Moroz et al. | |
| 2015/0370950 A1 | 12/2015 | Kawa et al. | |
| 2016/0025805 A1 | 1/2016 | Uppal et al. | |

FOREIGN PATENT DOCUMENTS

| | | |
|---|---|---|
| JP | 200350266 A | 2/2003 |
| JP | 2003149983 A | 5/2003 |
| JP | 2005149313 A | 6/2005 |
| JP | 2005252143 A | 9/2005 |
| JP | 2007264993 A | 10/2007 |
| JP | 2010266254 A | 11/2010 |
| JP | 2011233869 A | 11/2011 |
| JP | 5153089 B2 | 2/2013 |
| JP | 2013120852 A | 6/2013 |
| JP | 2014131063 A | 7/2014 |
| KR | 100480585 B1 | 6/2005 |
| KR | 2007109434 A | 11/2007 |
| KR | 20080045517 A | 5/2008 |
| KR | 20120125275 A | 11/2012 |

(56) References Cited

FOREIGN PATENT DOCUMENTS

| KR | 20130067213 A | 6/2013 |
|---|---|---|
| KR | 20140012012 A | 1/2014 |
| KR | 20140043399 A | 4/2014 |

OTHER PUBLICATIONS

U.S. Office Action dated Oct. 21, 2016 issued in co-pending U.S. Appl. No. 14/854,358.
U.S. Office Action dated Jan. 26, 2017 issued in co-pending U.S. Appl. No. 14/844,420.
U.S. Office Action dated Feb. 2, 2017 issued in co-pending U.S. Appl. No. 14/844,398.
"Binary Decoder", Electronics Tutorials, pp. 1-5 (2014).
"Standard cell", Wikipedia, The Free Encyclopedia, pp. 1-5 (2013).
Notice of Allowance dated May 15, 2017 issued in co-pending U.S. Appl. No. 14,844,420.
Notice of Allowance dated Mar. 2, 2017 issued in co-pending U.S. Appl. No. 14/854,358.
U.S. Office Action dated Jul. 11, 2017 issued in co-pending U.S. Appl. No. 14/844,398.

\* cited by examiner

METHOD OF DESIGNING LAYOUT OF SEMICONDUCTOR DEVICE

CROSS-REFERENCE TO RELATED APPLICATIONS

A claim for priority under 35 U.S.C. §119 is made to U.S. patent Provisional No. 62/052,076 filed Sep. 18, 2014, in the U.S. Patent and Trademark Office, and Korean Patent Application No. 10-2015-0033280 filed Mar. 10, 2015, in the Korean Intellectual Property Office, the entire contents of which are hereby incorporated by reference in their entirety.

BACKGROUND

Example embodiments of the inventive concepts described herein relate to a semiconductor device, and more particularly, relate to a method of designing a layout of a semiconductor device.

Usage of mobile devices such as a smart-phone, a tablet personal computer (PC), a digital camera, a MP3 player, and a personal digital assistant (PDA) is significantly increasing. As driving of multimedia and throughput of various data increase in this mobile device, a high-speed processor is largely applied to the mobile device. Various application programs may be driven on a mobile device. To drive various application programs, semiconductor devices such as a working memory (e.g., DRAM), a nonvolatile memory, and an application processor (AP) are used in the mobile device.

Lithography equipment may be quickly developed as compared with a scaled-down version of a design rule. Accordingly, example embodiments of methods of implementing a smaller pitch than a minimum and/or desired pitch implemented using lithography equipment are being studied. In at least one example embodiment, the method includes a self-align double patterning (hereafter referred to as "SADP") process. A structure of a smaller pitch than a minimum and/or desired pitch implemented using the lithography equipment may be formed using the SADP process. Accordingly, a semiconductor device having a fine pattern or a high degree of integration over a limitation of the lithography equipment may be easily formed using the SADP process.

When a layout design for the SADP is performed, constraint conditions based on a characteristic of the SADP is observed. Example embodiments of the inventive concepts may provide design and verification methods for easily implementing a layout of the semiconductor device manufactured using a SADP process.

SUMMARY

In at least one example embodiment of the inventive concepts, a method of forming a design capable of meeting constraint conditions of a layout design is based on a double patterning process of a semiconductor device and a layout design system.

In at least one example embodiment of the inventive concepts, a method of designing a layout of a semiconductor device includes receiving information on a size of a target chip and a unit placement width for forming a gate line through a SADP process by a layout design system, allocating an input and output area, a hard macro area, and a standard cell area at the target chip, and adjusting a width of the standard cell area by applying a gate generation rule for setting a width of at least one cell row located in the standard cell area to an odd number multiple of the unit placement width. The unit placement width corresponds to a width between centers of a pair of gate lines in the SADP process.

In accordance with another example embodiment of the inventive concepts, a method of designing a layout of a semiconductor device to which a SADP process is applied includes receiving a size of a chip and a design rule, allocating at least one hard macro area and a standard cell area at the chip, and adjusting a width of each cell row of the standard cell area so as to be set to an odd number multiple of a unit placement width in which a pair of gate lines are formed.

In accordance with still another example embodiment of the inventive concepts, a computer based system for designing a layout of a semiconductor device includes an input and output device for receiving geometric information of the semiconductor device or a design rule, a working memory configured to load a gate generation module for generating a gate line to be formed according to a SADP process and a placement and interconnection tool configured to generate a layout of the semiconductor device, and a central processing unit configured to execute the placement and interconnection tool and the gate generation module based on information provided from the input and output device, wherein the gate generation module sets a width of each cell row of a standard cell area allocated to the semiconductor device with an odd number multiple of a unit placement width.

In another example embodiment of the inventive concepts, a method of designing a placement and an interconnection of a semiconductor device includes receiving information on a width of a gate line of a target chip and geometric information on an interval between paired gate lines, allocating an input and output area in which an input and output pad is formed, at least one hard macro area and a standard cell area at the target chip, checking a gate generation rule for detecting whether a row-directional width of each cell row of the standard cell area is an odd number multiple of an interval between the paired gate lines, and adjusting the row-directional width of each cell row of the standard cell area, which violates the gate generation rule, to an odd number multiple of the interval between the paired gate lines based on the detection results.

A method of designing a layout and a layout design system according to at least one example embodiment of the inventive concepts may solve constraint conditions of a pattern generation rule due to a double patterning process.

In at least one example embodiment, a method of designing a placement and an interconnection of a semiconductor device is provided. The method includes receiving information on a width of a gate line of a target chip, allocating an input and output area in which an input and output pad is formed and a standard cell area of the target chip, checking a gate generation rule for detecting whether a row-directional width of each cell row of the standard cell area is an odd number multiple of an interval between paired gate lines, and adjusting the row-directional width of each cell row of the standard cell area, which violates the gate generation rule.

In at least one example embodiment, the adjusting operation includes adjusting the row-directional width of each cell row violating the gate rule to an odd number multiple of the interval between the paired gate lines based on the detection results. The row-directional width of each cell row of the standard cell area violating the gate generation rule may be adjusted by changing a size of a halo of a hard macro area adjacent thereto. In at least one example embodiment, the row-directional width of each cell row of the standard cell area violating the gate generation rule may be adjusted by moving positions of end cells at both sides of the standard cell area. The method may also include adjusting the row-directional width of a hard macro area which violates the gate generation rule, and forming the paired gate lines through a SADP process.

BRIEF DESCRIPTION OF THE FIGURES

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION

Figure 1:
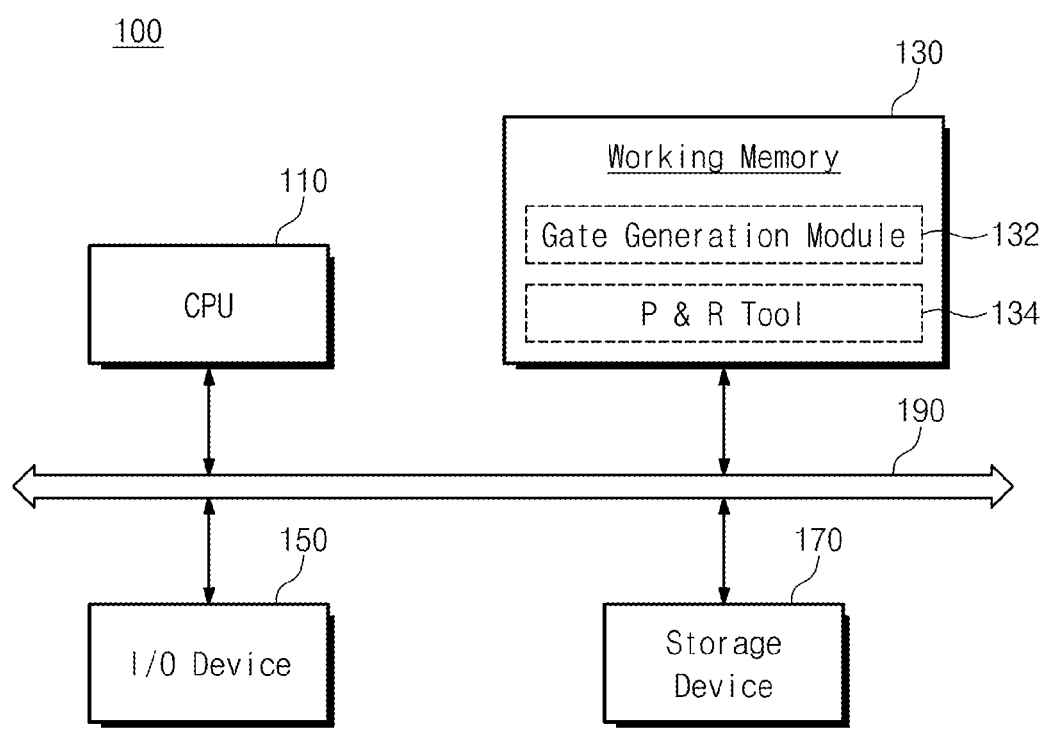
FIG. 1 is a block diagram illustrating a layout design system according to at least one example embodiment of the inventive concepts.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a layout design system 100 according to at least one example embodiment of the inventive concepts. Referring to FIG. 1, a layout design system 100 may include a central processing unit (CPU) 110, a working memory 130, an input and output device 150, a storage device 170, and a system bus 190. In at least one example embodiment, the layout design system 100 may be provided as an exclusive device for designing a layout of a semiconductor device. The layout design system 100 may be a computer for operating various simulation tools or design tools.

The CPU 110 may execute software (e.g., an application program, an operating system (OS), and device drivers) to be performed in the layout design system 100. The CPU 110 may perform an operating system (OS) (not illustrated) loaded onto the working memory 130. The CPU 110 may perform various application programs or design and verification tools which are based on the OS. For example, the CPU 110 may execute layout design tools, layout verification tools or design rule checker (DRC) tools which are loaded onto the working memory 130. The CPU 110 may drive a gate generation module 132 provided as a layout design tool in at least one example embodiment of the inventive concepts. The gate generation module 132 may be configured such that an even-number of gates are formed in the SADP process regardless of their locations or environment in the whole chip. This gate placement or generation rule is referred to as an even gate rule. Moreover, the CPU 110 may drive a placement and routing (P&R) tool 134 for placing and routing various hard macros or cells at an optimal position in a chip.

An OS or application program may be loaded onto the working memory 130. During booting of the layout design system 100, an OS image (not illustrated) stored in the storage device 170 may be loaded to the working memory based on a booting sequence. An overall input and output operation of the layout design system 100 may be supported by the OS. Likewise, application programs which are selected by a user or to provide a basic service may be loaded to the working memory 130. The gate generation module 132 and the P&R tool 134 may be loaded to the working memory 130.

The gate generation module 132 or the P&R tool 134 may be loaded from the storage device 170 to the working memory 130 as a layout design tool. Although not illustrated, the working memory 130 may further include tools for designing and verifying a schematic circuit or layout design tools for automatically changing a schematic circuit into a layout. The working memory 130 may be a volatile memory such as a static random access memory (SRAM) or a dynamic random access memory (DRAM) or a nonvolatile memory such as a phase-change random access memory (PRAM), a magnetic random access memory (MRAM), a resistive random access memory (ReRAM), a ferroelectrics random access memory (FRAM), and a NOR flash memory.

The gate generation module 132 may provide the gate placement rule in which an even number of gates are formed in the SADP process regardless of conditions. For example, the gate generation module 132 may apply an even number gate rule such that an even number of gates are formed in the SADP process to form standard cells regardless of their positions or environment in a chip. Gates generated through the SADP process may be formed with an even number to prevent and/or mitigate an increase in a cost due to an additional correction process. Accordingly, the gate generation module 132 may adjust a placement or an array of gates such that an even number of gates are formed in an area of standard cells regardless of any position or condition. The P&R tool 134 may use a netlist provided for a layout design or place an area of a hard macro or a standard cell at a position determined by a user.

The input and output device 150 may control a user input and a user output through user interface devices. For example, the input and output device 150 may include an input device such as a keyboard, a mouse, and a touch pad and an output device such as a monitor that receives a layout when the schematic verification is completed. The input and output device 150 may display a layout design procedure or simulation and verification results of the layout design system 100.

The storage device 170 may be provided as a storage medium of the layout design system 100. The storage device 170 may store an application program, an OS image, and various kinds of data. The storage device 170 may be provided as a memory card (e.g., a multimedia card (MMC), an embedded multimedia card (eMMC), a secure card (SD), a micro secure card (MicroSD)) or a hard disk drive (HDD). The storage device 170 may include a NAND Flash memory having a mass storage capacity. Also, the storage device 170 may include next-generation nonvolatile memories such as a PRAM, a MRAM, a ReRAM, a FRAM or a NOR flash memory.

The system bus 190 may be provided as an interconnector for providing a network in the layout design system 100. The CPU 110, the working memory 130, the input and output device 150, and the storage device 170 may be electrically connected through the system bus 190 to exchange data. However, the scope and spirit of the inventive concepts may not be limited thereto. For example, arbitration means may be further provided for effective management.

According to at least one example embodiment, the layout design system 100 may design a layout of a chip based on information about various gate levels provided for a layout design. The layout design system 100 may apply an even number gate rule allowing an even number of gates to be formed in the SADP process regardless of an environment condition or a position of a standard cell area, thereby making it possible to reduce errors and additional costs which occur in designing a layout of a semiconductor device to be manufactured in the SADP process based on the even number gate rule.

FIGS. 2A to 2E are diagrams schematically illustrating a SADP process. Referring to FIGS. 2A to 2E, an even number of patterns may be formed once a pattern is formed based on the SADP process.

Figure 2A:
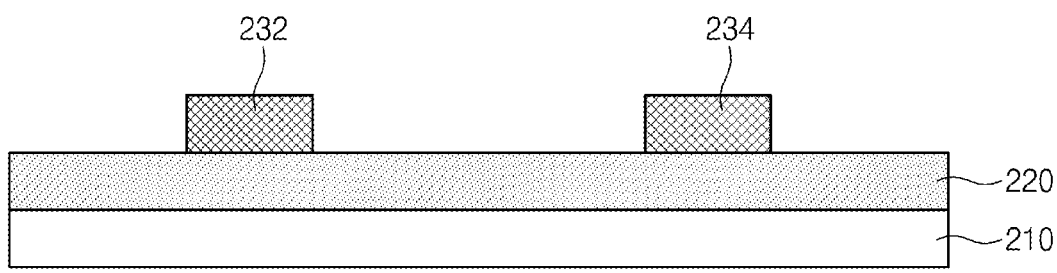
FIGS. 2A to 2E are diagrams schematically illustrating a SADP process.

Referring to FIG. 2A, a poly-silicon layer 220 for a gate electrode may be formed on a substrate 210, and a first pattern 232 and a second pattern 234 to be used as a mandrel may be formed on the poly-silicon layer 220. The first pattern 232 and the second pattern 234 may be formed through a lithography process.

Figure 2B:
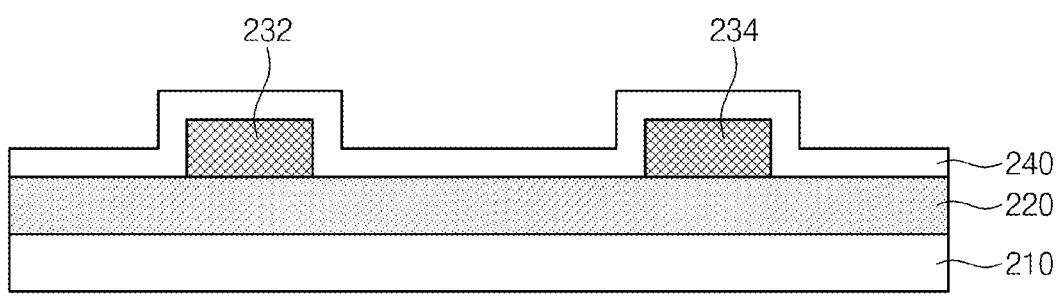

Referring to FIG. 2B, a spacer layer 240 may be formed on the first pattern 232 and the second pattern 234. The spacer layer 240 may be formed of a material having an etch selectivity with respect to the first pattern 232 and the second pattern 234. The spacer layer 240 may be formed using a silicon oxide such as a middle-temperature oxide (MTO), a high-temperature oxide (HTO), or an atomic layer deposition (ALD) oxide.

Figure 2C:
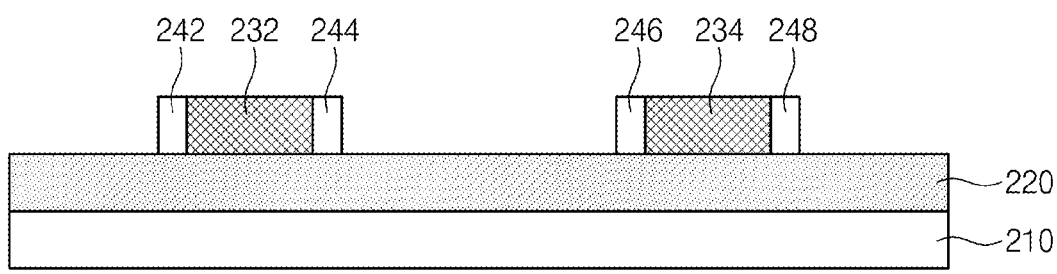

Referring to FIG. 2C, a portion of the spacer layer 240 may be removed, and thus spacers 242, 244, 246, and 248 may be formed on sidewalls of the first pattern 232 and the second pattern 234. For example, a process for removing a portion of the spacer layer 240 may include an etch-back process. The spacers 242, 244, 246, and 248 may be formed on the sidewalls of the first pattern 232 and the second pattern 234 by performing the etch-back process on the spacer layer 240.

Figure 2D:
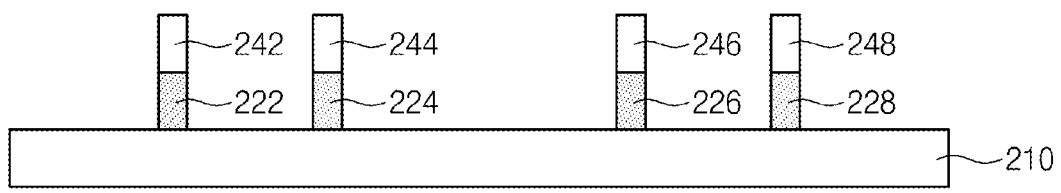

Referring to FIG. 2D, a shape in which the first pattern 232, the second pattern 234, and a portion of the poly-silicon layer 220 being an etch target layer are removed may be illustrated. The spacer layer 240 may be a material having an etch selectivity with respect to the first pattern 232 and the second pattern 234, and thus, the first and second patterns 232 and 234 may be removed using an etchant that etches the first and second patterns 232 and 234 but hardly etches the spacers 242, 244, 246, and 248. Moreover, the poly-silicon layer 220 may also be etched to form poly-silicon patterns 222, 224, 226, and 228 under the spacers 242, 244, 246, and 248.

Figure 2E:
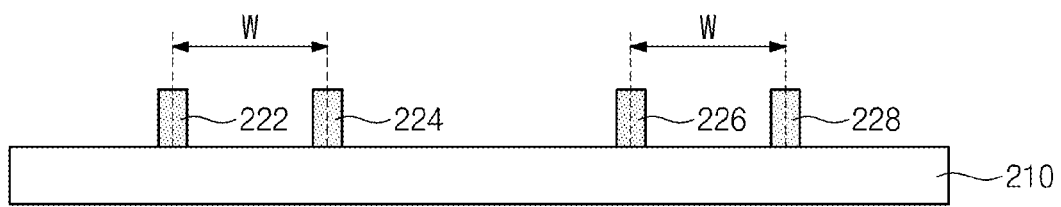

Referring to FIG. 2E, when the spacers 242, 244, 246, and 248 are removed, the poly-silicon patterns 222, 224, 226, and 228 to be used as gates may remain. As described above, two gates 222 and 224 may be formed by means of the first pattern 232 and two gates 226 and 228 may be formed by means of the second pattern 234. A distance W between centers of the gates 222 and 224 formed by means of the first pattern 232 may be referred to as a unit placement width. In short, two gates may be formed by means of one mandrel pattern.

According to at least one example embodiment of the SADP process described above, an even number of gates may be formed. In accordance with a gate generation method of at least one example embodiment of the inventive concepts, when conditions with respect to a specific chip are provided, a placement rule may be applied such that the even number of gate lines may be formed in the standard cell area.

Figure 3A:
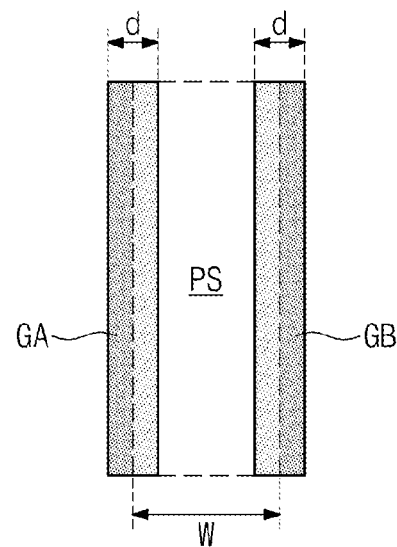
FIGS. 3A and 3B are diagrams schematically illustrating the number of gate line patterns formed when the SADP process is applied according to at least one example embodiment.
Figure 3B:
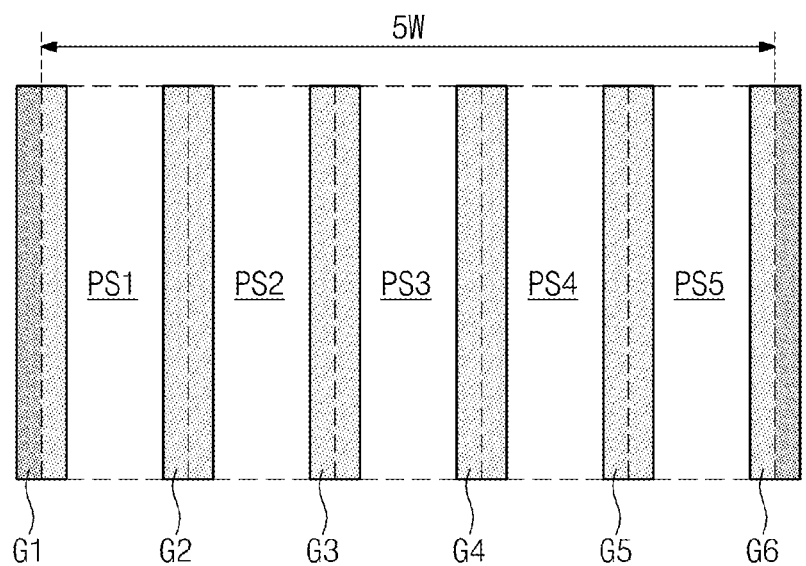

FIGS. 3A and 3B are diagrams schematically illustrating the number of gate line patterns formed when the SADP process is applied according to at least one example embodiment. FIG. 3A illustrates a structure of a placement site PS determined by one mandrel pattern. FIG. 3B illustrates gate line patterns G1 to G6 of PSs PS1 to PS5 determined by three mandrel patterns.

Referring to FIG. 3A, two gates GA and GB may be formed in one placement site PS. A gate width d of each of the two gates GA and GB and a unit placement width W may be formed as illustrated. When one unit placement width W is defined, two gate lines may be generated in a layout design operation. One unit placement width W may correspond to a distance between centers of gates GA and GB. That is, two gates may be allocated in one unit placement width W. For example, three gate lines may be generated in a placement width 2W to keep a distance of the unit placement width W.

Referring to FIG. 3B, six gates G1 to G6 may be formed in a plurality of placement sites PS1 to PS5. A gate width d and a unit placement width W of each of the six gates G1 to G6 may be formed as illustrated in FIG. 3A. That is, the six gates G1 to G6 may be generated in a placement width 5W allocated in a standard cell area. Finally, in the standard cell area, (n+1) gates formed to have an interval of the unit placement width W may be disposed within a width nW (i.e., n is a natural number) of total placement sites. However, when the width nW of a placement site is not properly limited in a standard cell area, an odd number of gates may be generated. That is, constraint conditions on the width nW of a placement site of a standard cell area may be required to generate an even number of gates. The width nW of a placement site of a standard cell area may be adjusted in determining the width nW of a placement site of a standard cell area to define a size of this placement site such that an even number of gates are formed.

Figure 4A:
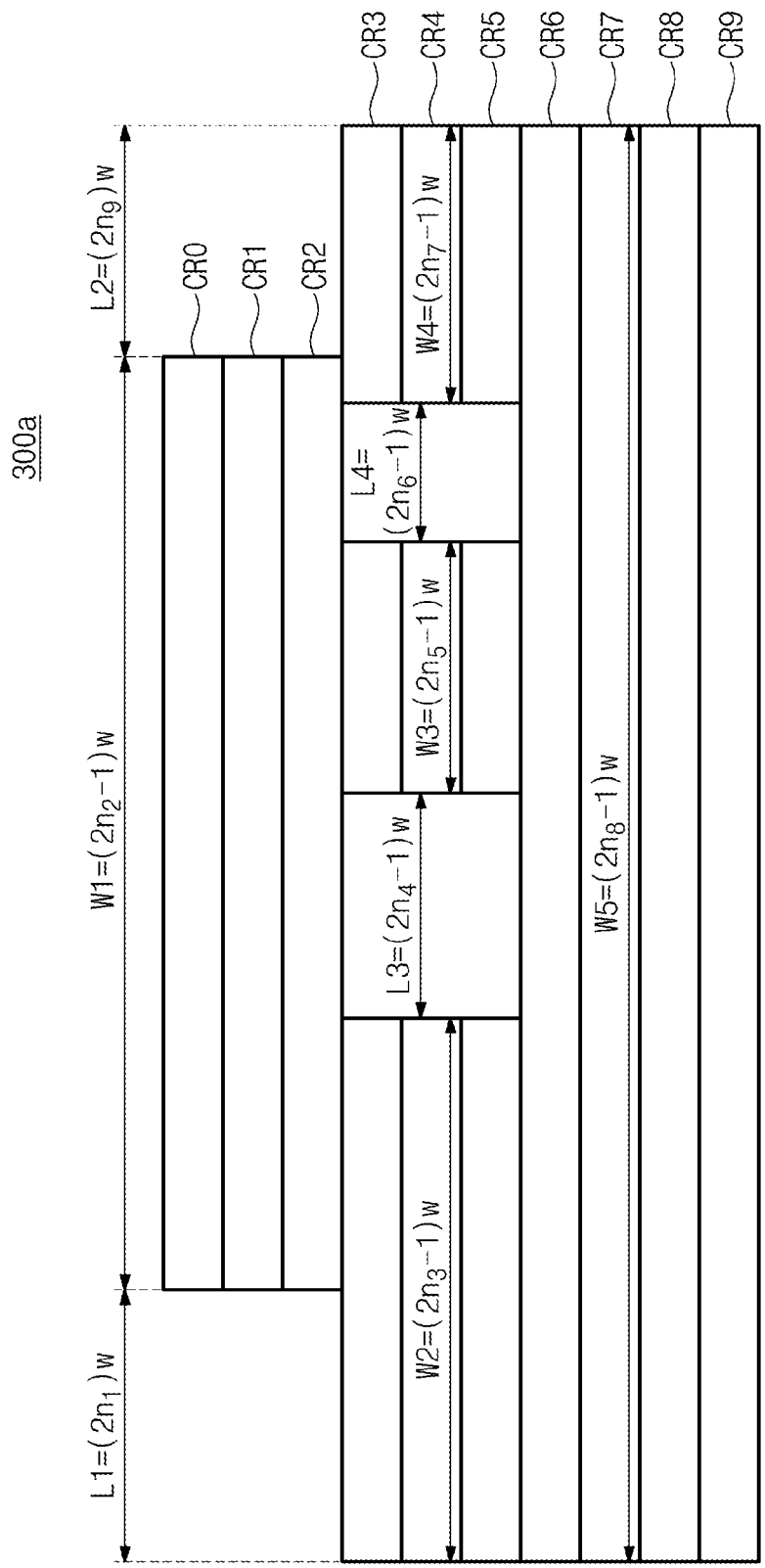
FIGS. 4A and 4B are diagrams schematically illustrating a width of a placement site on a specific chip area, according to a gate generation rule of at least one example embodiment of the inventive concepts.
Figure 4B:
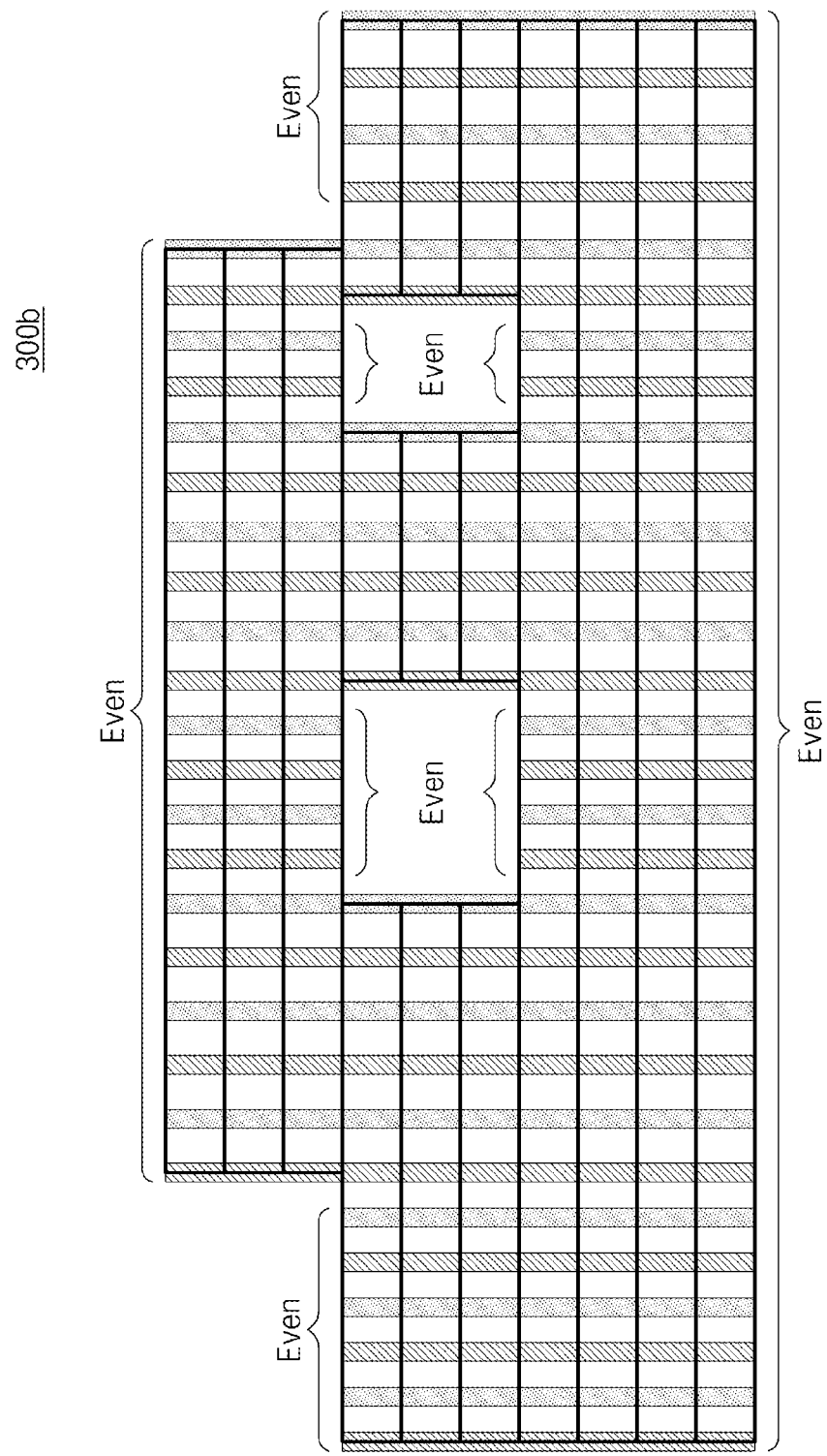

FIGS. 4A and 4B are diagrams schematically illustrating a width of a placement site PS on a specific chip area determined according to a gate generation rule according to at least one example embodiment of the inventive concepts.

Referring to FIG. 4A, a placement site width on each of a hard macro area and standard cell areas may be defined. Here, "w" denotes a unit placement width.

Above all, a placement site width W1 of each of cell rows CR0, CR1, and CR2 which share the same gates may be defined as $(2n_2-1)w$. Here, $n_2$ is a natural number. That is, a placement site width W1, in which an even number of gates are formed, may be set to an odd number multiple of a unit site width w so as to have the same unit placement width w in a standard cell area.

A placement site width W2 of each of standard cell areas formed on a left side of cell rows CR3 to CR5 may be defined as $(2n_3-1)w$. Here, $n_3$ is a natural number. For example, a placement site width W2 for providing an even number of gates at a standard cell area of which the left side is adjacent to an input and output area and the right side is adjacent to a hard macro area may be set to an odd number multiple of the unit site width w.

A placement site width W3 of each standard cell area formed in a center area of the cell lows CR3 to CR5 may be defined as $(2n_5-1)w$. Here, $n_5$ is a natural number. The placement site width W3 for providing an even number of gates at a standard cell area located between hard macros may be set to an odd number multiple of the unit site width w.

A placement site width W4 of each of standard cell areas formed on a right side of cell rows CR3 to CR5 may be defined as $(2n_7-1)w$. Here, $n_7$ is a natural number. The placement site width W4 for providing an even number of gates at a standard cell area, of which the left side is adjacent to a hard macro area and the right side is adjacent to an input and output area, may be set to an odd number multiple of the unit site width w.

A placement site width W5 of each of standard cell areas corresponding to cell rows CR6 to CR9 in which the whole area of a cell row is allocated to a standard cell area may be defined as $(2n8-1)w$. Here, n8 is a natural number.

A gate generation rule concerning the placement site widths W1, W2, W3, W4, and W5 may provide an even number of gates at a standard cell area. That is, a placement site width Wi (i.e., "i" being a natural number) of a standard cell area allocated to an arbitrary area in a chip may be set to an odd number multiple of the unit site width w.

Moreover, a width of a hard macro may be set to an odd number multiple or an even number multiple of the unit site width w based on its position. For example, a width L1 of a hard macro placed on a left side of cell rows CR0, CR1, and CR2 may be defined as $(2n_1)w$. Here, $n_1$ is a natural number. That is, the width L1 of a hard macro, which is adjacent to an outside of a chip or an input and output area, may be an even number multiple of the unit site width w. A width L2 of a hard macro, which is placed on a right side of cell rows CR0, CR1, and CR2 may be defined as $(2n_9)w$.

However, widths L3 and L4 of hard macros surrounded with standard cell areas may be defined as $(2n_4-1)w$ and $(2n_6-1)w$, respectively. That is, a width of a hard macro surrounded with standard cell areas may be set to an odd number multiple of the unit site width w. Whenever this gate generation rule is applied, the number of gates of a standard cell area located around hard macros may be an even number. When a width of a hard macro and a width of a standard cell area satisfy the described conditions, the gate generation rule may be applied all together and a violation may not occur.

FIG. 4B is a layout in which gates are allocated according to a gate generation rule shown in FIG. 4A. Referring to FIG. 4B, when a gate generation rule according to at least one example embodiment of the inventive concepts is applied, the number of gates divided by a hard macro area in a chip area 300b may be an even number. Moreover, the number of gates included in standard cell areas may be an even number.

Figure 5:
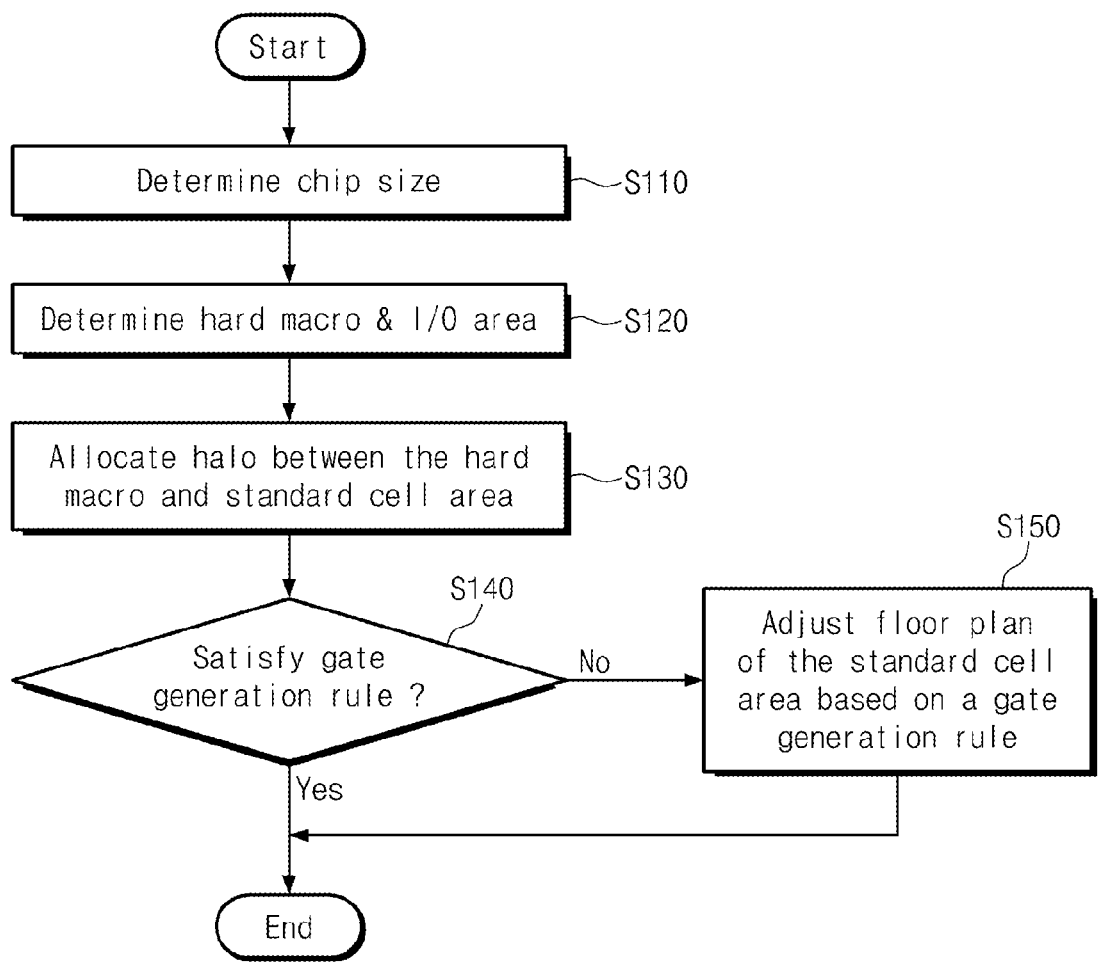
FIG. 5 is a flow chart illustrating a layout design method of a layout design system of at least one example embodiment of the inventive concepts.

FIG. 5 is a flow chart illustrating a layout design method of a layout design system, according to an example embodiment of the inventive concepts. Referring to FIG. 5, chip specification information or verification information on a schematic circuit such as a gate-level netlist may be provided.

In operation S110, geometric information or a chip size may be determined. The chip size may be determined based on the number of various standard cells to be formed in a chip for providing various functions determined at a schematic design level, a memory size, and a core block size.

In operation S120, an input and output area in which an input and output circuit and a pad of the chip will be formed may be determined. Moreover, a position of a hard macro or a hard block may be determined in a core area except for an input and output area. For example, a hard macro, in which an analog circuit block, a static random access memory (SRAM), and a CPU are formed, may be formed to be independent of a standard cell area.

In operation S130, a halo may be set in a hard macro. The halo may correspond to an edge area of a hard macro for distinguishing an integrated circuit formed in the hard macro and a standard cell area. A width of a standard cell area may be adjusted by adjusting the size of a halo area.

In operation S140, a layout design system may determine whether a width of a standard cell area violates a gate generation rule. When a width of a standard cell area or a hard macro area satisfies the gate generation rule, the method may end. On the other hand, when a width of a standard cell area or a hard macro area violates a gate generation rule, the method may proceed to operation S150.

In operation S150, a width of a standard cell area may be adjusted. When a width of a standard cell area corresponds to an even number multiple of a unit placement width w, a position of a cell including a start point or an end point of a cell row of a standard cell area may be adjusted. Here, a width of a standard cell area may be adjusted by adjusting a position of a start point or an end point of a standard cell, but the inventive concepts may be not limited hereto. This gate generation rule may be applied in practically displaying various cells in a standard cell area.

Figure 6:
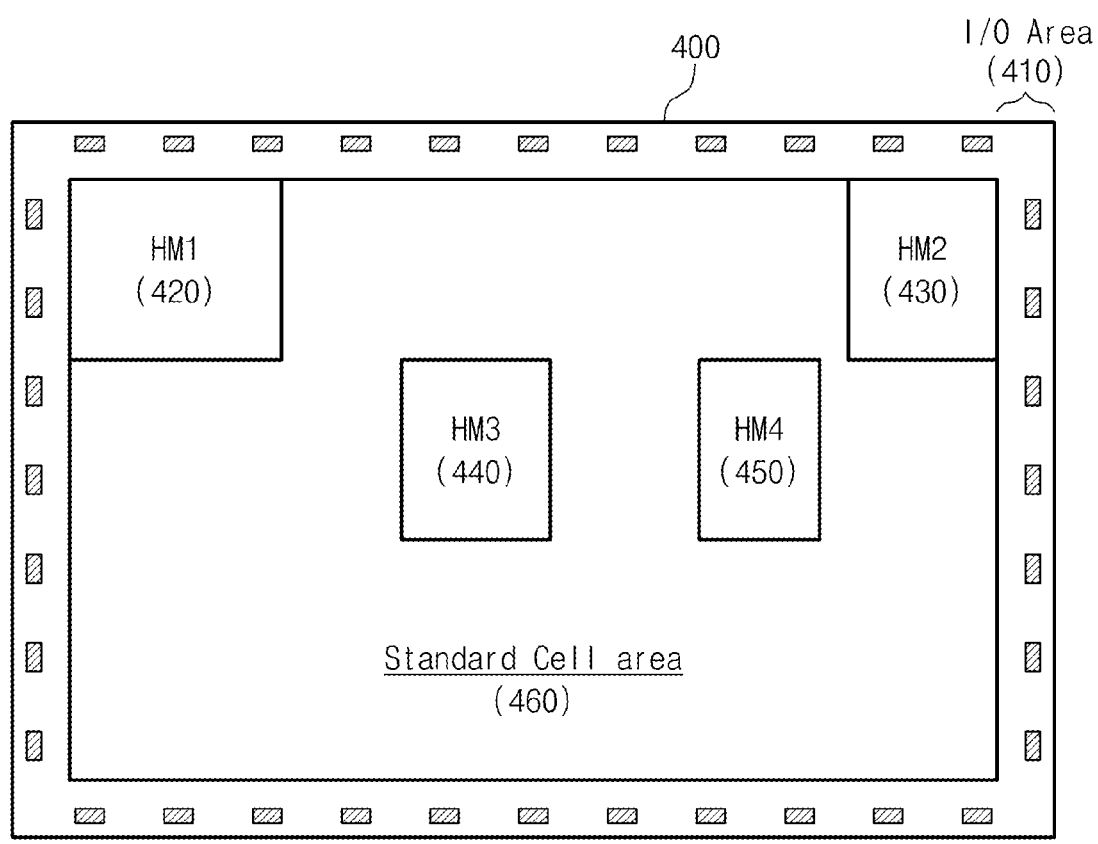
FIGS. 6 and 7 are chip plan views illustrating operations described in FIG. 5.
Figure 7:
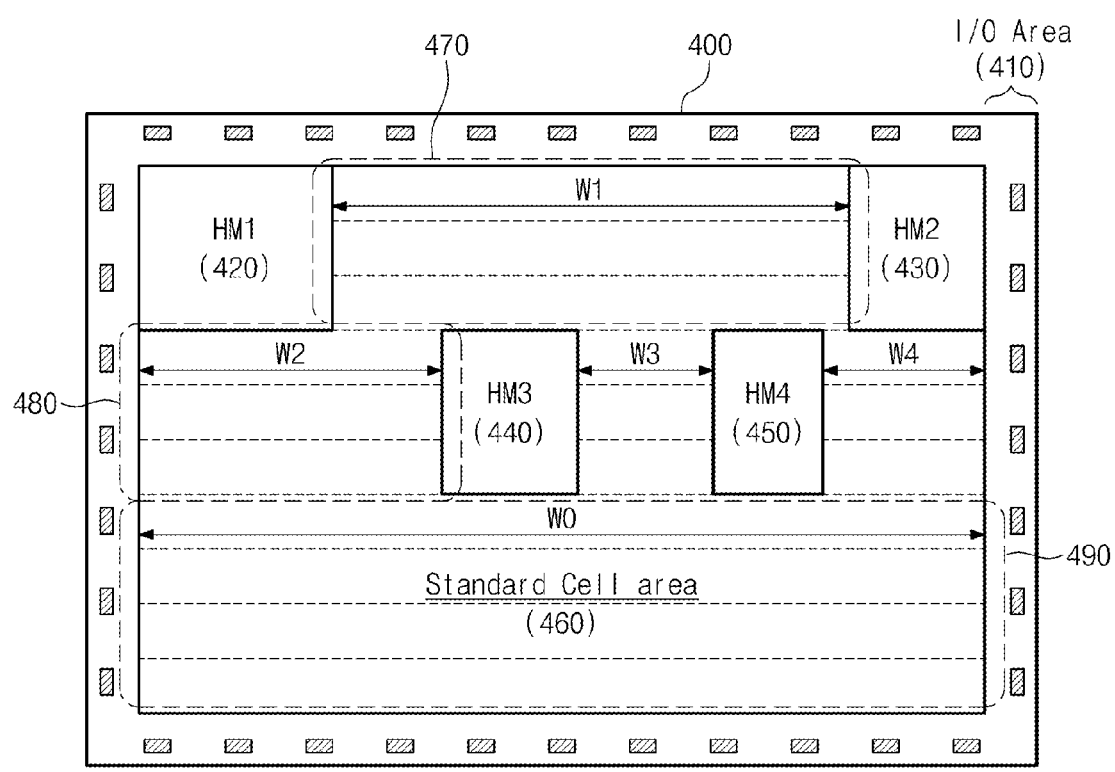

FIGS. 6 and 7 are chip plan views illustrating operations described in FIG. 5.

FIG. 6 illustrates a shape in which an input and output (hereinafter referred to as "I/O") area and a hard macro of a chip 400 are implemented. FIG. 7 illustrates cell rows concerning each of standard cell areas of a chip 400.

Referring to FIG. 6, an I/O area and a hard macro area may be allocated when a size of a chip is determined. For example, a size of an I/O area 410, in which I/O pads for exchanging data or signals with the outside of a chip, I/O buffers, and drivers are formed, may be determined to allocate the I/O area and the hard macro area. Moreover, hard macro areas 420, 430, 440, and 450 in a chip 400 may be determined to allocate the I/O area and the hard macro area. Positions of the hard macro areas 420, 430, 440, and 450 may be determined based on a distance between an I/O pad and each of the hard macro areas 420, 430, 440, and 450, a configuration of a power rail, or a relative distance between other cores and each of the hard macro areas 420, 430, 440, and 450. The remainder may be allocated to a standard cell area 460 when the I/O area 410 and the hard macro areas 420, 430, 440, and 450 are determined.

FIG. 7 is a plan view of a width of a standard cell area. Referring to FIG. 7, a standard cell area may be classified based on three attributes. The standard cell area may be classified into a standard cell area 470 in which hard macro areas 420 and 430 are located on both sides thereof, a standard cell area 480 located between an I/O area 410 and a hard macro area 440, and a standard cell area 490 not overlapped with a hard macro in the I/O area 410.

Above all, a width W1 of the standard cell area 470, in which the hard macro areas 420 and 430 are located at both sides thereof, may correspond to an odd number multiple of a unit placement width w. A size of a width of this cell area may be identically applied to a width W3 of a standard cell area. A width W2 of the standard cell area 480 located between the I/O area 410 and the hard macro area 440 may be also set to an odd number multiple of the unit placement width w. Likewise, a width W4 of a standard cell area may be also set to an odd number multiple of the unit placement width w. This rule may be identically applied to the standard cell area 490.

Figure 8:
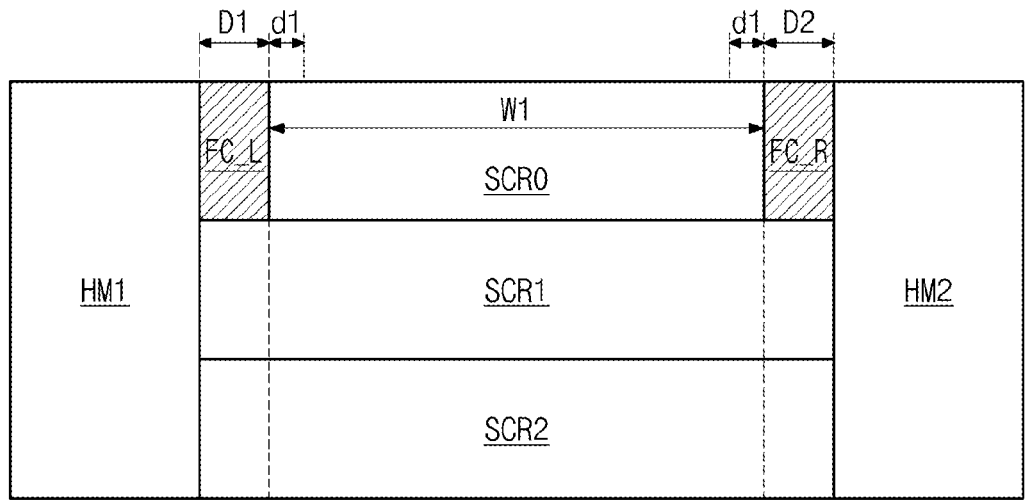
FIG. 8 is a diagram schematically illustrating a standard cell area of FIG. 7.

FIG. 8 is a diagram schematically illustrating a standard cell area 470 of FIG. 7. Referring to FIG. 8, in at least one example embodiment, a standard cell area between hard macros HM1 and HM2 may be formed over three cell rows SCR0, SCR1, and SCR2.

A left end cell FC_L may be located at a left side of the cell row SCR0 of a standard cell area. Moreover, a right end cell FC_R may be placed at a right side of the cell row SCR0. Each of the end cells FC_L and FC_R may protect cells included in a standard cell area between a standard cell area and hard macros. That is, the end cells FC_L and FC_R configured to substantially prevent and/or mitigate various interferences which occur in a manufacture process due to a configuration difference between a core formed in a hard macro and various cells formed in a standard cell area may be placed. A width of the left end cell FC_L may be D1 and a width of the right end cell FC_R may be D2. Here, the widths D1 and D2 of the end cells FC_L and FC_R may be set to be identical to each other or to be different from each other.

According to an example embodiment of the inventive concepts, positions of the end cells FC_L and FC_R may be moved to a left side or a right side to adjust a width W1 of a standard cell area. For example, the width W1 of a standard cell area may be reduced by moving the left end cells FC_L to a right side as much as an interval d1. Moreover, a position of the right end cell FC_R may be moved to set a width W1 of a standard cell area to an odd number multiple of the unit placement width w. A width W1 of a standard cell area may be adjusted to be set to an odd number multiple of the unit placement width w by moving a position of the end cells FC_L and FC_R in a hard macro direction and increasing the width W1 of a standard cell area.

In at least one example embodiment, a configuration of the end cells FC_L and FC_R may be applied to cell rows SCR1 and SCR2, because cell rows SCR0, SCR1 and SCR2 located between hard macros HM1 and HM2 share the same gates.

Figure 9:
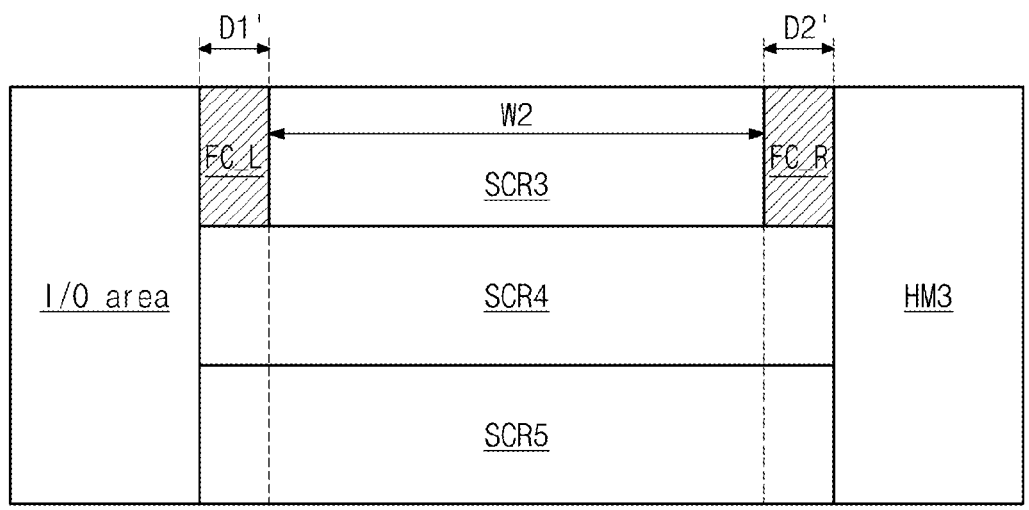
FIG. 9 is a diagram schematically illustrating a standard cell area of FIG. 7.

FIG. 9 is a diagram schematically illustrating a standard cell area 480. Referring to FIG. 9, a standard cell area between an input and output area and a hard macro HM3 may be formed over three cell rows SCR3, SCR4, and SCR5.

A left end cell FC_L may be located on a left side of the cell row SCR3 of a standard cell area. Moreover, a right end cell FC_R may be placed at a right side of the cell row SCR3. Each of the end cells FC_L and FC_R may protect cells included in a standard cell area between a standard cell area and hard macros. That is, the end cells FC_L and FC_R for preventing and/or mitigating various interferences which occur in a manufacture process due to a configuration difference between a core formed in a hard macro and various cells formed in a standard cell area may be placed. A width of the left end cell FC_L may be D1' and a width of the right end cell FC_R may be D2'. Here, the width D1' of the left end cells FC_L and the width D2' of the right end cells FC_R may be set to be equal to widths D1 and D2 of the end cells FC_L and FC_R shown in FIG. 8 or to be different from widths D1 and D2 of the end cells FC_L and FC_R shown in FIG. 8.

According to an example embodiment of the inventive concepts, positions of end cells FC_L and FC_R may be moved to a left side or a right side to adjust a width W2 of a standard cell area. For example, the width W2 of a standard cell area may be reduced by moving the left end cells FC_L to a right side as much as a specific distance. Moreover, a position of the right end cell FC_R may be moved to set a width W2 of a standard cell area to an odd number multiple of the unit placement width w. A width W2 of a standard cell area may be adjusted to be set to an odd number multiple of the unit placement width w by moving a position of the end cells FC_L and FC_R in an arbitrary direction and increasing the width W2 of a standard cell area. A configuration of the end cells FC_L and FC_R may be applied to both cell rows SCR4 and SCR5.

Figure 10:
FIG. 10 is a diagram schematically illustrating a standard cell area of FIG. 7.

FIG. 10 is a diagram schematically illustrating a standard cell area 490. Referring to FIG. 10, a standard cell area 490 between an input and output areas may be formed over four cell rows SCR6, SCR7, SCR8, and SCR9.

A left end cell FC_L may be located on a left side of the cell row SCR6 of a standard cell area. Moreover, a right end cell FC_R may be placed at a right side of the cell row SCR6. Each of the end cells FC_L and FC_R may protect cells included in a standard cell area between a standard cell area and hard macros. That is, the end cells FC_L and FC_R for preventing various interferences which occur in a manufacture process due to a configuration difference between a core formed in a hard macro and various cells formed in a standard cell area may be placed. A width of the left end cell FC_L may be D1" and a width of the right end cell FC_R may be D2". Here, the width D1" of the left end cells FC_L and the width D2" of the right end cells FC_R may be set to be equal to widths D1 and D2 of the end cells FC_L and FC_R shown in FIG. 8 or to be different from widths D1 and D2 of the end cells FC_L and FC_R shown in FIG. 8.

According to an example embodiment of the inventive concepts, positions of end cells FC_L and FC_R may be moved to a left side or a right side to adjust a width W0 of a standard cell area. For example, the width W0 of a standard cell area may be reduced by moving the left end cells FC_L to a right side as much as a specific distance. Moreover, a position of the right end cell FC_R may be moved to set a width W0 of a standard cell area to an odd number multiple of the unit placement width w. A width W0 of a standard cell area may be adjusted to be set to an odd number multiple of the unit placement width w by moving a position of the end cells FC_L and FC_R in an arbitrary direction and increasing the width W0 of a standard cell area. A configuration of the end cells FC_L and FC_R may be applied to both cell rows SCR7, SCR8 and SCR9.

Figure 11:
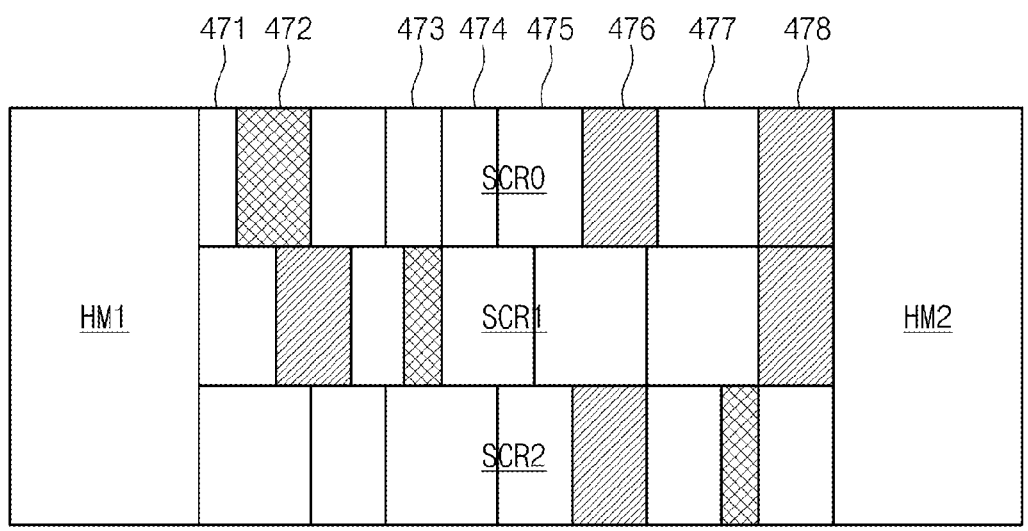
FIG. 11 is a diagram illustrating a method of adjusting the number of gates in a standard cell area according to another example embodiment of the inventive concepts.

FIG. 11 is a diagram illustrating a method of adjusting the number of gates in a standard cell area, according to another example embodiment of the inventive concepts. Referring to FIG. 11, a standard cell area between hard macros HM1 and HM2 may be formed over three cell rows SCR0, SCR1, and SCR2. However, a width of the standard cell area may be determined in placing a plurality of standard cells 471 to 478. That is, a gate generation rule of at least one example embodiment of the inventive concepts may be applied to dispose a plurality of standard cells 471 to 478.

Meanwhile, a memory system according to at least one example embodiment of the inventive concepts may be installed using a package of various shapes. For example, a semiconductor device may be installed using packages such as a package on package (PoP), a ball grid arrays (BGAs), a chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi chip package (MCP), a wafer-level fabricated package (WFP), and a wafer-level processed stack package (WSP).

While the inventive concepts have been described with reference to example embodiments, it will be apparent to those skilled in the art that various changes and modifications may be made without departing from the spirit and scope of the present invention. Therefore, it should be understood that the above embodiments are not limiting, but illustrative.

What is claimed is:
1. A method comprising:
receiving information on a size of a target chip and a unit placement width for forming a gate line through a self-align double patterning (SADP) process of a layout design system;
allocating an input and output area, a hard macro area, and a standard cell area at the target chip;
adjusting a width of the standard cell area by applying a gate generation rule for setting a width of at least one cell row located in the standard cell area to an odd number multiple of the unit placement width, the unit placement width corresponding to a width between centers of adjacent gate lines to be formed in the standard cell area in the SADP process; and
forming a set of gate lines according to the SADP process in the standard cell area having adjusted-width cell rows, such that
adjacent gate lines of the set of gate lines are spaced apart from respective centers thereof by the unit placement width,
the set of gate lines extends across an entirety of the standard cell area, and a quantity of gate lines, of the set of gate lines, in the standard cell area is an even number multiple gate lines.

2. The method of claim 1, wherein the gate generation rule sets a width of a hard macro located in a first area of the hard macro area to an even number multiple of the unit placement width and a width of a hard macro located in a second area thereof to an odd number multiple of the unit placement width.

3. The method of claim 2, wherein the first area corresponds to a chip area having a rectangular shape of which at least one face is not adjacent to the standard cell area.

4. The method of claim 2, wherein the second area corresponds to a chip area having a rectangular shape of which four faces are adjacent to the standard cell area.

5. The method of claim 1, wherein the adjusting the width of the standard cell area includes moving positions of gate lines of the standard cell area to a left side or a right side.

6. The method of claim 5, wherein the adjusting the width of the standard cell area includes moving a position of at least one end cell at least one end of the standard cell area to a left side or a right side.

7. The method of claim 5, wherein the adjusting the width of the standard cell area includes adjusting the width of the standard cell area by changing a size of a halo of the hard macro area.

8. The method of claim 7, wherein the width of the standard cell area is adjusted by a unit of at least one cell row.

9. The method of claim 1, further comprising:
placing standard cells in the standard cell area, the placing of standard cells including applying the gate generation rule.

10. A method comprising:
receiving a size of a chip;
allocating at least one hard macro area and a standard cell area at the chip;
adjusting a width of each cell row of the standard cell area by applying a gate generation rule for setting a width of at least one cell row located in the standard cell area to an odd number multiple of a unit placement width associated with a spacing between adjacent gate lines to be formed in the standard cell are; and
forming a set of gate lines according to a self-align double patterning (SADP) process in the standard cell area having adjusted-width cell rows, such that
adjacent gate lines of the set of gate lines are spaced apart from respective centers thereof by the unit placement width,
the set of gate lines extends across an entirety of the standard cell area and
a quantity of gate lines, of the set of gate lines, in the standard cell area is an even number multiple of gate lines.

11. The method of claim 10, wherein the unit placement width corresponds to a width in which a pair of gate lines are to be formed in the standard cell area.

12. The method of claim 11, wherein the unit placement width corresponds to a distance between centers of adjacent gate lines to be formed in the standard cell area.

13. The method of claim 10, wherein the adjusting a width includes moving a position of an end cell formed in a cell row of the standard cell area.

14. The method of claim 10, wherein the adjusting a width includes adjusting a size of a halo of the hard macro area.

15. A method comprising:
receiving information on a width of a gate line of a target chip;
allocating an input and output area in which an input and output pad is formed and a standard cell area of the target chip;
checking a gate generation rule for detecting whether a row-directional width of each cell row of the standard cell area is an odd number multiple of a particular interval between adjacent gate lines to be formed in the standard cell area;
adjusting the row-directional width of each cell row, of the standard cell area, which violates the gate generation rule by being a width that is not the odd number multiple of the particular interval between adjacent gate lines to be formed in the standard cell area, the adjusting including adjusting the row-directional width to be the odd number multiple of the particular interval; and
forming a set of gate lines according to a self-align double patterning (SADP) in the standard cell area having adjusted row-directional width cell rows, such that
adjacent gate lines of the set of gate lines are spaced apart from respective centers thereof by the particular interval,
the set of gate lines extends across an entirety of the standard cell area, and
a quantity of gate lines, of the set of gate lines, in the standard cell area is an even number multiple of gate lines.

16. The method of claim 15, wherein the adjusting includes adjusting the row-directional width of each cell row violating the gate generation rule to an odd number multiple of the particular interval between the adjacent gate lines to be formed in the standard cell area, based on a result of the detecting whether the row-directional width of each cell row of the standard cell area is the odd number multiple of the particular interval between adjacent gate lines to be formed in the standard cell area.

17. The method of claim 16, wherein the row-directional width of each cell row of the standard cell area violating the gate generation rule is adjusted by changing a size of a halo of a hard macro area adjacent thereto.

18. The method of claim 16, wherein the row-directional width of each cell row of the standard cell area violating the gate generation rule is adjusted by moving positions of end cells at both sides of the standard cell area.

19. The method of claim 15, further comprising:
adjusting the row-directional width of a hard macro area which violates the gate generation rule.

* * * * *